(12) United States Patent
Kim et al.

(10) Patent No.: US 8,704,595 B2
(45) Date of Patent: Apr. 22, 2014

(54) PREDISTORTION APPARATUSES AND METHODS

(75) Inventors: Young-Hoon Kim, Daejeon (KR); Gweon Do Jo, Daejeon (KR); Jung Hoon Oh, Daejeon (KR); Jae Ho Jung, Daejeon (KR)

(73) Assignee: Electronics & Telecommunications Research Institute, Daejeon (KR)

( * ) Notice: Subject to any disclaimer, the term of this patent is extended or adjusted under 35 U.S.C. 154(b) by 292 days.

(21) Appl. No.: 13/331,377

(22) Filed: Dec. 20, 2011

(65) Prior Publication Data
US 2012/0154041 A1 Jun. 21, 2012

(30) Foreign Application Priority Data

Dec. 21, 2010 (KR) .................. 10-2010-0131456

(51) Int. Cl.
*H03F 1/26* (2006.01)
(52) U.S. Cl.
USPC .................. 330/149; 375/296; 455/114.3
(58) Field of Classification Search
USPC .................. 330/149; 375/296; 455/114.3
See application file for complete search history.

(56) References Cited

U.S. PATENT DOCUMENTS

| | | | |
|---|---|---|---|
| 6,642,786 B1 | 11/2003 | Jin et al. | |
| 6,973,139 B2 * | 12/2005 | Ahn et al. | 375/297 |
| 7,149,257 B2 * | 12/2006 | Braithwaite | 375/296 |
| 7,366,252 B2 * | 4/2008 | Cova et al. | 375/296 |
| 7,577,408 B2 * | 8/2009 | Muller et al. | 455/114.3 |
| 8,472,556 B2 * | 6/2013 | Shi et al. | 375/297 |
| 8,564,368 B1 * | 10/2013 | Bai | 330/149 |
| 2013/0200948 A1 * | 8/2013 | Lee et al. | 330/10 |

OTHER PUBLICATIONS

J. Kim et. al., Digital predistortion of wideband signals based on power amplifier model with memory, Electronics Letters, Nov. 8, 2011, pp. 1417-1418, vol. 37 No. 23.
M. Jin et. al., A Novel Predistorter for Power Amplifier, Microwave and Millimeter Wave Technology, Proc. of ICMMT 2002, pp. 1129-1133.
A. Zhu et. al., Digital Predistortion for Envelope-Tracking Power Amplifiers Using Decomposed Piecewise Volterra Series, IEEE Trans. on Microwave Theory an Techniques, Oct. 2008, pp. 2237-2247, vol. 56, No. 10.

* cited by examiner

*Primary Examiner* — Patricia Nguyen
(74) *Attorney, Agent, or Firm* — William Park & Associates Patent Ltd.

(57) ABSTRACT

Provided is a predistortion apparatus which performs predistortion by reflecting a memory effect when linearizing an output of a nonlinear device using a wideband signal. The predistortion apparatus includes a predistortion unit and a coefficient extraction unit. The predistortion unit selects and outputs one of outputs of the sub-predistorters as an output signal according to intensity of an input signal. The coefficient extraction unit selects one of a plurality of coefficient extractors according to intensity of a nonlinear signal which is generated in response to the output signal, extracts a plurality of predistortion coefficients with the nonlinear signal and the output signal, and delivers the extracted predistortion coefficients to the predistortion unit. Accordingly, the memory effect is reflected even when the input signal is a wideband signal.

20 Claims, 9 Drawing Sheets

PREDISTORTION APPARATUSES AND METHODS

CROSS-REFERENCE TO RELATED APPLICATIONS

This U.S. non-provisional patent application claims priority under 35 U.S.C. §119 of Korean Patent Application No. 10-2010-0131456, filed on Dec. 21, 2010, the entire contents of which are hereby incorporated by reference.

BACKGROUND OF THE INVENTION

The present invention disclosed herein relates to a technology which linearly compensates for nonlinear distortion, and more particularly, to a predistortion apparatus and method, which reflect a memory effect to linearize an output of a nonlinear device.

In a typical communication system, a power amplifier is an essential element for transmitting/receiving a power signal, and is known as one of components that have the important role of an entire communication system in terms of the function or the manufacturing cost.

A power amplifier requires high linear characteristic in order for a transmitting end to amplify a signal without distortion. However, a power amplifier is a representative nonlinear device having nonlinear characteristic as an analog component. Also, as the use of a wideband signal is recently generalized due to enhancement of a data transfer rate, the memory effect where the past input signal is reflected in determination of an output signal is becoming important characteristic of a power amplifier together with nonlinear characteristic.

Since the nonlinear characteristic of a power amplifier causes Inter Modulation Distortion (IMD) and thus interference arises between an adjacent channel and an inband signal, the nonlinear characteristic becomes the cause that degrades system performance.

Moreover, since the memory effect of a power amplifier causes interference between transmission signal symbols, the distortion of a signal may arise.

SUMMARY OF THE INVENTION

The present invention provides a predistortion apparatus and method which reflect a memory effect when compensating for the nonlinear distortion of a system using a wideband signal.

The present invention also provides a predistortion apparatus and method which reflect a memory effect, thereby having enhanced performance for compensating for nonlinear distortion.

The present invention also provides a predistortion apparatus and method which compensate for nonlinear distortion and also have improved complexity in implementation by reflecting a memory effect.

The present invention also provides a predistortion apparatus and method which compensate for nonlinear distortion and also have a low nonlinear maximum-order term by reflecting a memory effect.

Embodiments of the present invention provide a predistortion apparatus including: a predistortion unit including a plurality of sub-predistorters which respectively predistort an applied input signal with a plurality of separate predistortion coefficients, and selecting and outputting one of outputs of the sub-predistorters as an output signal according to intensity of the input signal; and a coefficient extraction unit selecting one of a plurality of coefficient extractors according to intensity of a nonlinear signal which is generated in response to the output signal, extracting a plurality of predistortion coefficients with the nonlinear signal and the output signal, and delivering the extracted predistortion coefficients to the predistortion unit.

In other embodiments of the present invention, a predistortion apparatus includes: a controller outputting a control signal according to intensity of an applied input signal; a predistortion unit including a plurality of sub-predistorters which respectively predistort an applied input signal with a plurality of separate predistortion coefficients, and selecting and outputting one of outputs of the sub-predistorters as an output signal according to the control signal; and a coefficient extraction unit selecting one of a plurality of coefficient extractors according to the control signal, extracting a plurality of predistortion coefficients with the output signal and a nonlinear signal which is generated in response to the output signal, and delivering the extracted predistortion coefficients to the predistortion unit.

In still other embodiments of the present invention, a predistortion method includes: predistorting an applied input signal into a plurality of distortion signals with a plurality of predistortion functions having respective separate predistortion coefficients, and selectively outputting one of the distortion signals according to intensity of the input signal; selecting one algorithm from among a plurality of adaptive algorithms according to intensity of a nonlinear signal, which is generated in response to the output distortion signal, to extract a plurality of predistortion coefficients from the nonlinear signal and the output distortion signal; and repeatedly updating the separate predistortion coefficients to the extracted predistortion coefficients until nonlinearity of the nonlinear signal is improved at a predetermined level.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
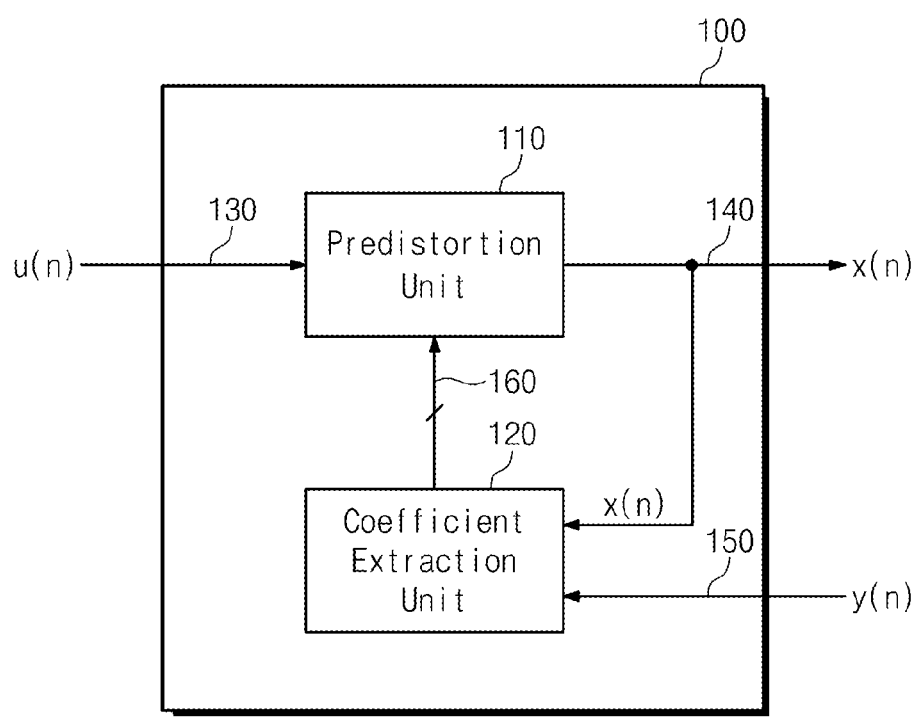
FIG. 1 is a block diagram illustrating a predistortion apparatus according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

It should be construed that foregoing general illustrations and following detailed descriptions are exemplified and an additional explanation of claimed inventions is provided. Reference numerals are indicated in detail in preferred embodiments of the present invention, and their examples are represented in reference drawings. In every possible case, like reference numerals are used for referring to the same or similar elements in the description and drawings.

In this disclosure below, when it is described that one comprises (or includes or has) some elements, it should be understood that it may comprise (or include or has) only those elements, or it may comprise (or include or have) other elements as well as those elements if there is no specific limitation.

Moreover, each of terms such as "... unit", "... part" and "apparatus" described in specification denotes an element for performing at least one function or operation, and may be implemented in hardware, software or the combination of hardware and software.

Hereinafter, in specification, a power amplifier being a representative example of a nonlinear device will be described as a specific example for describing a predistortion apparatus and method according to embodiments of the present invention. However, it should be understood that the spirit and scope of the present invention is not limited to a power amplifier which will be described below as a representative example to aid in understanding the present invention.

Characteristic of a power amplifier is categorized into memoryless characteristic where an output signal is determined only by a current input signal and memory characteristic where the output signal is determined by a past input signal as well as the current input signal.

A signal processed in the power amplifier is a wideband signal, and as a Peak-to-Average Power Ratio (PAPR) of a signal increases, memory characteristic is increased by the influences of the matching, bias and thermal characteristics of the power amplifier. A digital predistortion apparatus based on such memory effect becomes an important factor for determining the entire characteristic of a transmission system.

In a predistortion apparatus, there are models ranging from a relatively simple memoryless model, which is not based on the memory effect of the power amplifier, to a Volterra series model based on the memory effect of the power amplifier as a nonlinear series model. For example, there are various Volterra series models such as Wiener-Hammerstein model, memory polynomial model, and Wiener model of simplified Volterra series.

The Volterra series model corresponds to a general scheme that represents a nonlinear system having the memory effect, but a simplified Volterra series model is practically applied due to complexity and difficulty in extraction of a parameter. When a digital predistortion apparatus is implemented with the simplified Volterra series model, linearization performance and implemetability have a trade-off relationship.

Predistortion Apparatus 1

FIG. 1 is a block diagram illustrating a predistortion apparatus according to an embodiment of the present invention.

Referring to FIG. 1, a predistortion apparatus 100 according to an embodiment of the present invention includes a predistortion unit 110 and a coefficient extraction unit 120.

The predistortion unit 110 receives an input signal u(n) 130 and a plurality of predistortion coefficients 160, and outputs an output signal x(n) 140 that is generated by predistorting the received input signal 130. The predistortion coefficients 160 are used for an operation where the predistortion unit 110 predistorts the input signal 130, and received by the coefficient extraction unit 120. The predistortion unit 110 includes a plurality of sub-predistorters (not shown), each of which predistorts the input signal 130. The predistortion unit 110 outputs only one of outputs of the sub-predistorters as the output signal 140 according to intensity of the received input signal 130.

The coefficient extraction unit 120 receives the output signal 140 of the predistortion unit 110 and a nonlinear signal y(n) 150, extracts the predistortion coefficients 160 using the signals 140 and 150, and delivers the extracted predistortion coefficients 160 to the predistortion unit 110. The coefficient extraction unit 120 includes a plurality of coefficient extractors (not shown), and selects one coefficient extractor from among the coefficient extractors according to intensity of the nonlinear signal 150. The selected coefficient extractor extracts the predistortion coefficients 160 using the signals 150 and 140, and delivers the extracted predistortion coefficients 160 to the predistortion unit 110.

Coefficient Extraction Unit 1

Figure 2:
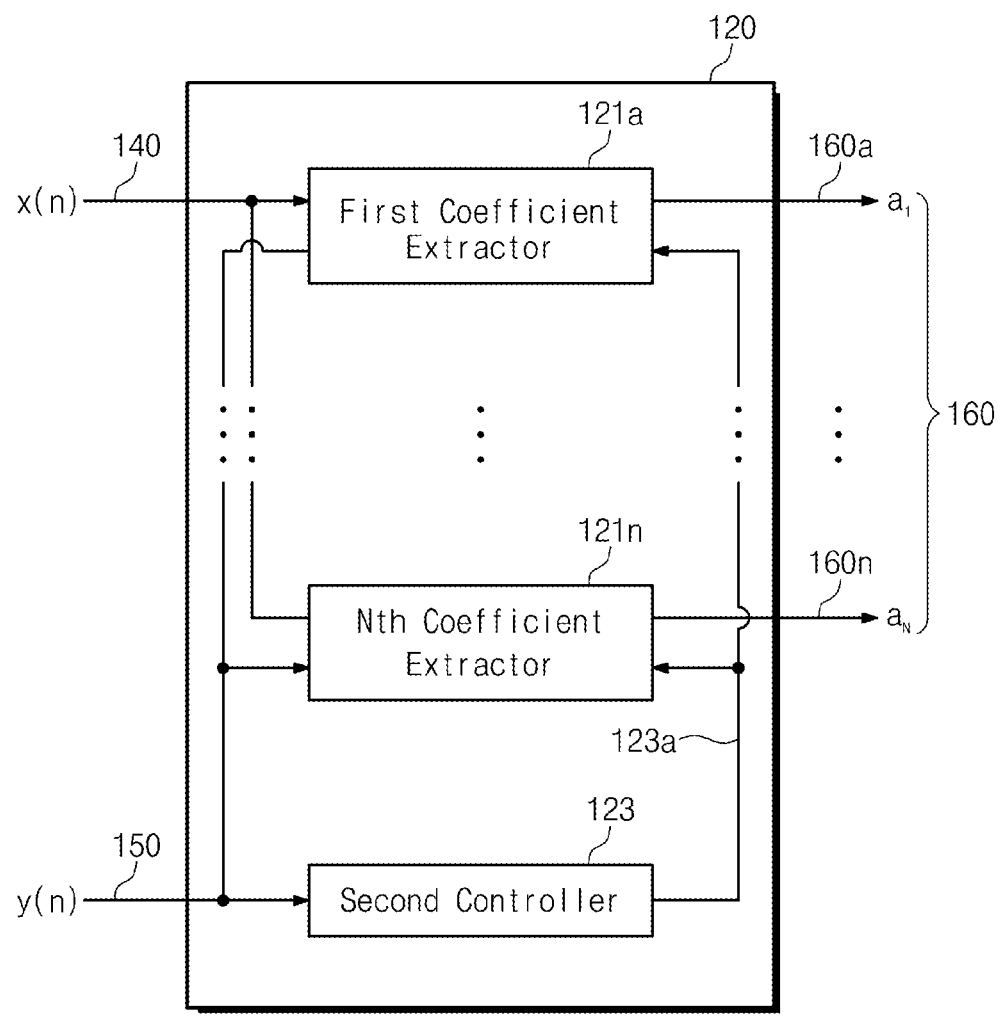
FIG. 2 is a block diagram illustrating a coefficient extraction unit included in a predistortion apparatus according to an embodiment of the present invention.

FIG. 2 is a block diagram illustrating a coefficient extraction unit included in a predistortion apparatus according to an embodiment of the present invention.

Referring to FIG. 2, the coefficient extraction unit 120 includes a plurality of coefficient extractors 121a to 121n and a second controller 123.

The second controller 123 receives the nonlinear signal 150 to output a second control signal 123a. The second control signal 123a is generated according to intensity of the received nonlinear signal 150, and allows one (for example, 121a) of the coefficient extractors 121a to 121n to be selected.

Each coefficient extractor (for example, 121a) receives the nonlinear signal 150, the second control signal 123a and the output signal 140 of the predistortion unit 110 to output a predistortion coefficient (for example, 160a, $a_1$). However, one coefficient extractor (for example, 121a) that is selected from among the coefficient extractors 121a to 121n according to the second control signal 123a performs the above-described input/output operation, and the other coefficient extractors 121b to 121n do not operate. Herein, each of the predistortion coefficients 160a to 160n is composed of a plurality of coefficients.

One coefficient extractor (for example, 121a) selected according to the second control signal 123a extracts a predistortion coefficient (for example, 160a) using the received nonlinear signal 150 and output signal 140. Adaptive algorithms such as Recursive Least Square (RLS) and Least Mean Square (LMS) may be used for extracting a predistortion coefficient (for example, 160a). Also, the predistortion coefficients 160 may be polynomial coefficients that are included in a Volterra series model based on the memory effect or a model applying Volterra series.

Equations (1) to (4) below are used for an operation where each coefficient extractor (for example, 121a) according to an embodiment of the present invention extracts a predistortion coefficient (for example, 160a).

$$X_1(n) = \sum_{p=1}^{P_1} \sum_{q_1=0}^{N_1-1} a_{1,p,q_1} z(n-q_1)|z(n-q_1)|^{p-1} \quad (1)$$

$$e_1 = x(n) - x_1(n) \quad (2)$$

where z(n) is a value that is obtained by dividing the nonlinear signal 150 by an amplification gain of a nonlinear device (for example, a power amplifier), $a_{1,p,q_1}$ are a plurality of polynomial coefficients of which the predistortion coefficient 160a specified according to a variable (p, $q_1$) are composed, and $e_1$ indicates an error between the output signal 140 and $x_1(n)$ in Equation (1).

Equations (1) and (2) are used for the first coefficient extractor 121a. The first coefficient extractor 121a extracts the predistortion coefficient 160a where a value of $e_1$ becomes minimized, and delivers the extracted coefficient to the predistortion unit 110.

Likewise, Equations (3) and (4) below are used when the other coefficient extractors 121b to 121n extract the predistortion coefficients 160b to 160n, respectively. The detailed descriptions of the coefficient extractors 121b to 121n are the same as the above description of the first coefficient extractor 121a.

$$X_N(n) = \sum_{p=1}^{P_N} \sum_{q_N=0}^{N_N-1} a_{N,p,q_N} z(n-q_N)|z(n-q_N)|^{p-1} \quad (3)$$

$$e_N = x(n) - x_N(n) \quad (4)$$

Predistortion Unit 1

Figure 3:
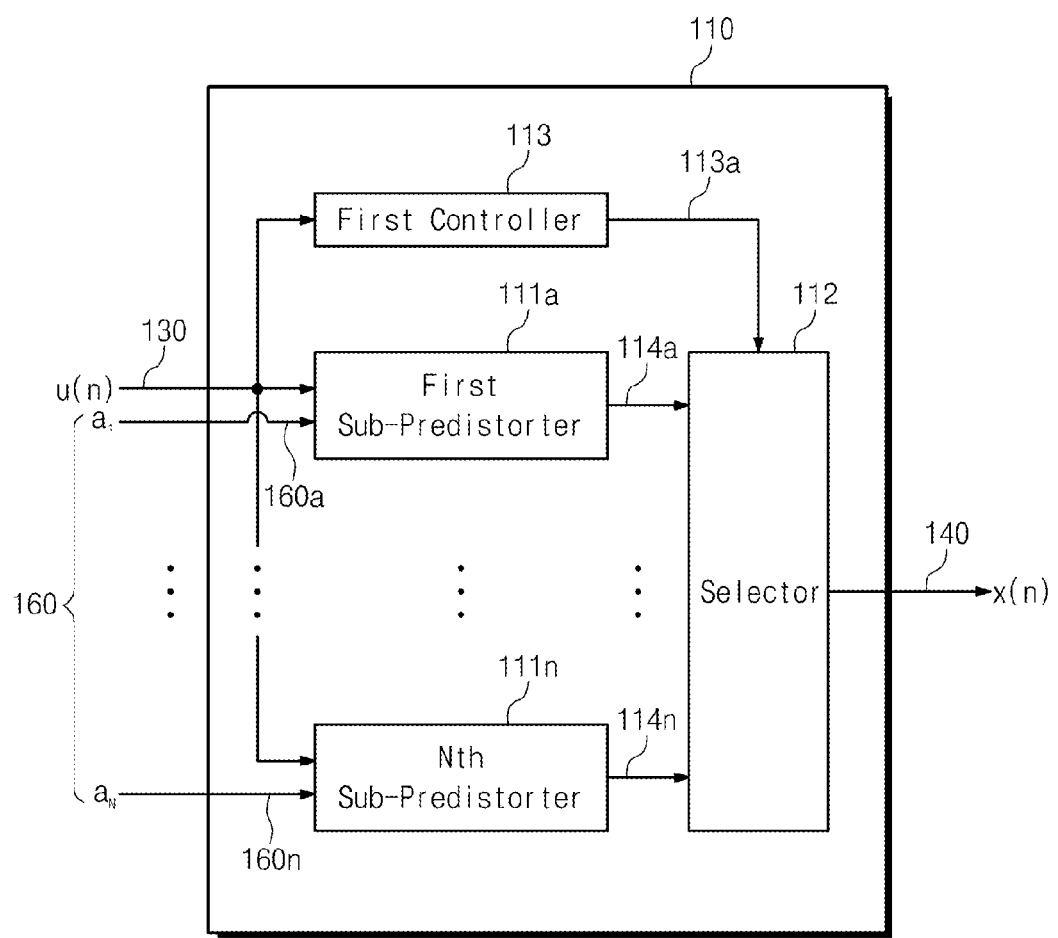
FIG. 3 is a block diagram illustrating a predistortion unit included in a predistortion apparatus according to an embodiment of the present invention.

FIG. 3 is a block diagram illustrating a predistortion unit included in a predistortion apparatus according to an embodiment of the present invention.

Referring to FIG. 3, the predistortion unit 110 includes a plurality of sub-predistorters 111a to 111n, a first controller 113, and a selector 112.

The first controller 113 receives the input signal 130 to output a first control signal 113a. The first control signal 113a is generated according to intensity of the received input signal 130, and allows one of outputs 114a to 114n of the sub-predistorters 111a to 111n to be selected. As a result, the selected output becomes the output signal 140 of the predistortion unit 110.

Each sub-predistorter (for example, 111a) receives the input signal 130 and a predistortion coefficient (for example, 160a) to output a signal (for example, 114a) that is generated by predistorting the received input signal 130. As a result, the sub-predistorters 111a to 111n predistort the input signal 130 with the predistortion coefficients 160a to 160n to output the outputs 114a to 114n to the selector 112, respectively. However, an output selected as the output signal 140 of the predistortion unit 110 is determined by the selector 112.

The selector 112 receives the outputs 114a to 114n of the respective sub-predistorters 111a to 111n and the first control signal 113a to output one of the received outputs 114a to 114n as the output signal 140.

Predistortion Coefficient Extraction and Update 1

The nonlinear signal 150 is generated in response to the output signal 140 of the predistortion unit 110. When a nonlinear device is a power amplifier, the nonlinear signal 150 is a signal that is generated by amplifying the output signal 140 by an equivalent amplification gain. Accordingly, a value that is obtained by dividing intensity of the nonlinear signal 150 by an amplification gain corresponds to intensity of an output signal. Also, the output signal 140 is a signal that is generated by predistorting the input signal 130, and thus when a classification reference based on intensity of a nonlinear signal is the same as a classification reference based on intensity of an input signal, classification based on intensity of the nonlinear signal 150 corresponds to classification based on intensity of the input signal 130.

Therefore, when a classification reference based on intensity of the nonlinear signal 150 is the same as a classification reference based on intensity of the input signal 130 and the number of the sub-predistorters 111a to 111n is equal to the number of the coefficient extractors 121a to 121n, each sub-predistorter (for example, 111a) and each coefficient extractor (for example, 121a) have a constant correspondence relationship. Referring to FIGS. 2 and 3, the predistortion coefficient 160a that is extracted by the first coefficient extractor 121a selected according to intensity of the nonlinear signal 150 is delivered to the first sub-predistorter 111a. Herein, the first coefficient extractor 121a extracts the predistortion coefficient 160a using the output signal 140, which is generated through predistortion in the first sub-predistorter 111a selected according to intensity of the input signal 130, and the nonlinear signal 150 generated in response to the output signal 140. Therefore, the predistortion coefficient of the first sub-predistorter 111a is updated to the predistortion coefficient 160a that is extracted in the first coefficient extractor 121a. In this scheme, the other second to Nth sub-predistorters 111b to 111n and the other second to Nth coefficient extractors 121b to 121n have a constant correspondence relationship.

As a result, in the case of the predistortion apparatus according to an embodiment of the present invention, a signal inputted to the sub-predistorters 111b to 111n is not a signal divided according to a certain reference (for example, intensity of a signal) but is the input signal 130 entirely. Also, even in the case for coefficient extraction, a predistorted signal that is generated with the entirety of input signal 130 becomes the nonlinear signal 150 by a nonlinear device (for example, a power amplifier), and predistortion coefficients to be used in the respective sub-predistorters 111b to 111n are extracted with the generated nonlinear signal 150. Therefore, when the predistortion apparatus according to an embodiment of the present invention linearizes an output of a nonlinear device that uses a wideband signal, the memory effect is reflected more effectively than a typical predistortion apparatus, the nonlinear maximum-order term of the predistortion apparatus is lowered, and moreover, the complexity of configuration is decreased.

Predistortion Apparatus 2

Figure 4:
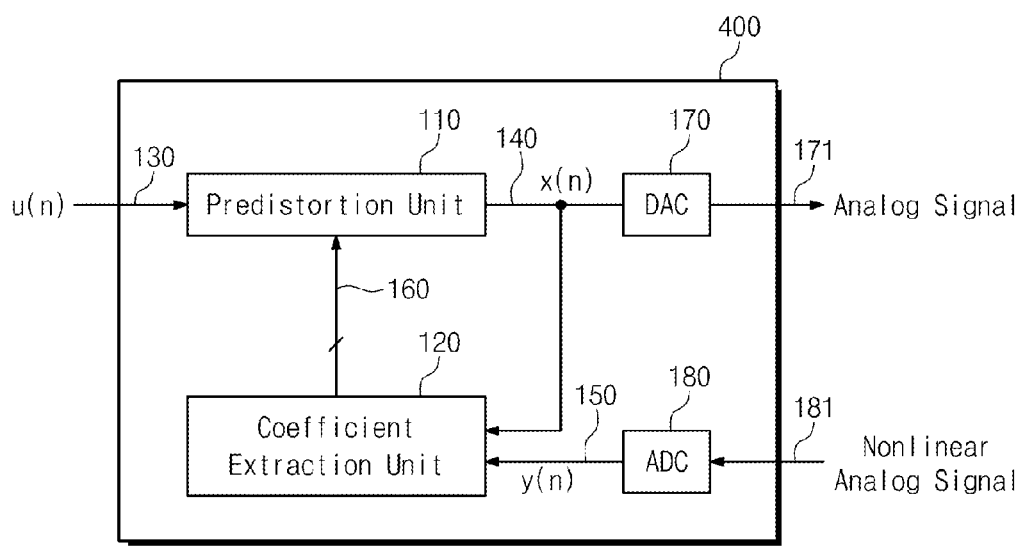
FIG. 4 is a block diagram illustrating a predistortion apparatus according to another embodiment of the present invention.

FIG. 4 is a block diagram illustrating a predistortion apparatus according to another embodiment of the present invention.

Referring to FIG. 4, a predistortion apparatus 400 according to another embodiment of the present invention includes a predistortion unit 110, a coefficient extraction unit 120, a digital-to-analog converter (DAC) 170, and an analog-to-digital converter (ADC) 180.

The detailed configurations of the predistortion unit 110 and coefficient extraction unit 120 are as described above with reference to FIGS. 1 to 3. An input signal 130, an output signal 140, and a nonlinear signal 150 are digital signals.

The DAC 170 receives the output signal 140 of the predistortion unit 110, and converts the output signal 140 into an analog signal 171 to output the converted analog signal. When a nonlinear device (not shown) is an analog circuit, the DAC 170 converts the predistorted output signal 140 into the analog signal 171 and delivers the analog signal 171 to the nonlinear device.

The ADC 180 receives a nonlinear analog signal 181 that is generated in response to the analog signal 171, and converts the nonlinear analog signal 181 into the nonlinear signal 150 to output the converted signal 150 to the coefficient extraction unit 120.

Predistortion Apparatus 3

Figure 5:
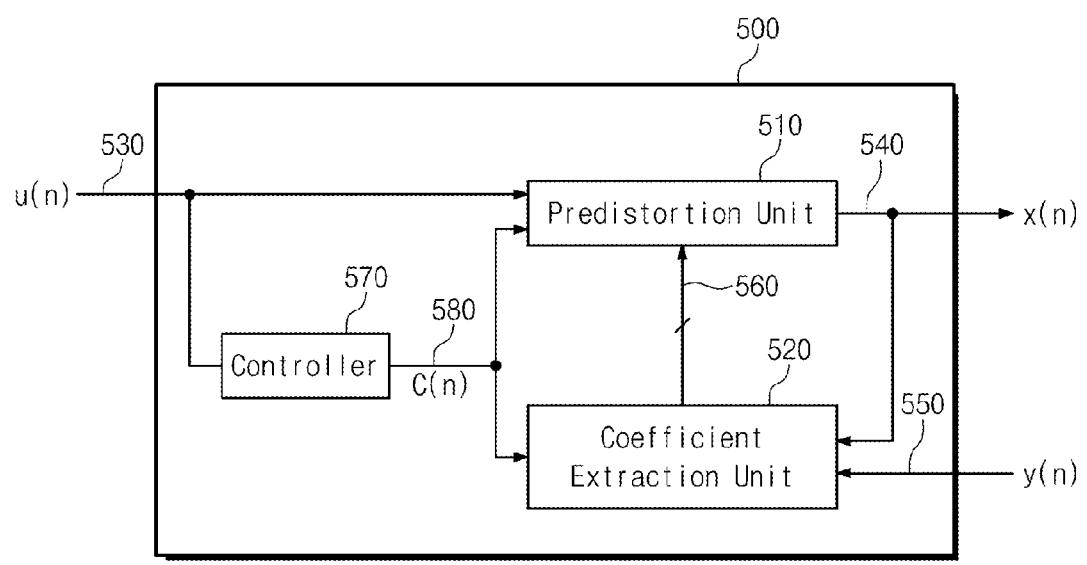
FIG. 5 is a block diagram illustrating a predistortion apparatus according to another embodiment of the present invention.

FIG. 5 is a block diagram illustrating a predistortion apparatus according to another embodiment of the present invention.

Referring to FIG. 5, a predistortion apparatus 500 according to another embodiment of the present invention includes a predistortion unit 510, a coefficient extraction unit 520, and a controller 570.

The controller 570 receives an input signal u(n) 530 to output a control signal c(n) 580. The control signal 580 is generated according to intensity of the input signal 530 and is delivered to the predistortion unit 510 and the coefficient extraction unit 520.

The predistortion unit 510 receives the control signal 580, the input signal 530 and a plurality of predistortion coefficients 560, and outputs an output signal x(n) 540 that is generated by predistorting the received input signal 530. The predistortion coefficients 560 are used in an operation where the predistortion unit 510 predistorts the input signal 530, and received by the coefficient extraction unit 520. The predistortion unit 510 includes a plurality of sub-predistorters (not shown), each of which predistorts the input signal 530. The predistortion unit 510 outputs only one of outputs of the sub-predistorters as the output signal 540 according to intensity of the control signal 580.

The coefficient extraction unit 520 receives the output signal 140 of the predistortion unit 110, the control signal 580 and a nonlinear signal y(n) 550, extracts the predistortion coefficients 560 using the signals 540, 580 and 550, and delivers the extracted predistortion coefficients 560 to the predistortion unit 510. The coefficient extraction unit 520 includes a plurality of coefficient extractors (not shown), and selects one coefficient extractor from among the coefficient extractors according to the control signal 580. The selected coefficient extractor extracts the predistortion coefficients 560 using the nonlinear signal 550 and the output signal 540, and delivers the extracted predistortion coefficients 560 to the predistortion unit 510.

Coefficient Extraction Unit 2

Figure 6:
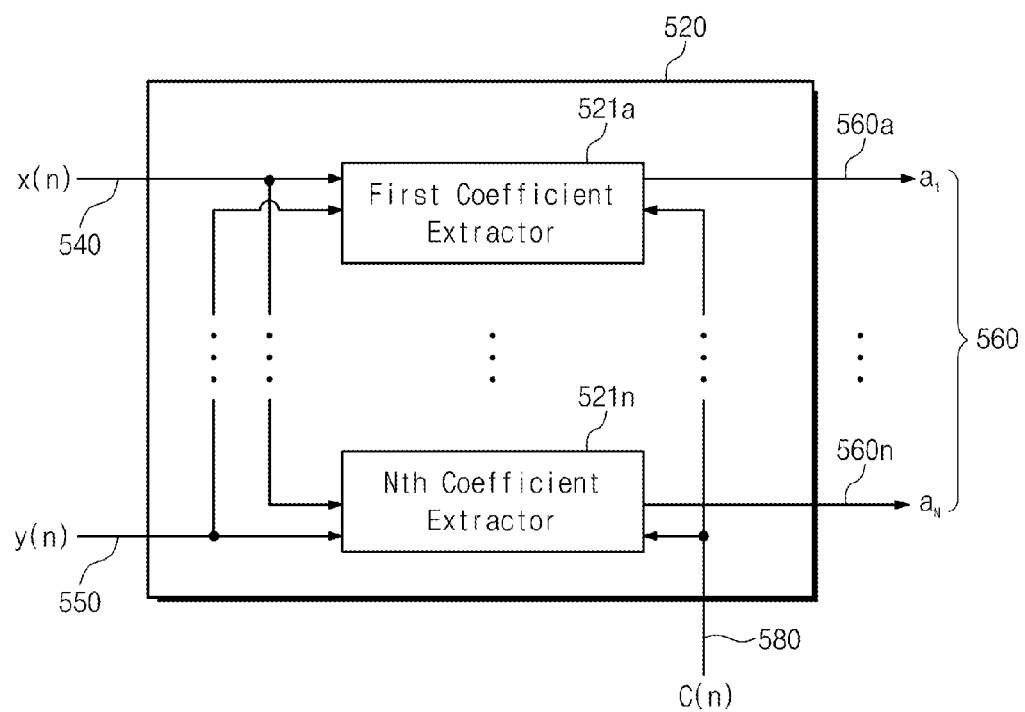
FIG. 6 is a block diagram illustrating a coefficient extraction unit included in a predistortion apparatus according to another embodiment of the present invention.

FIG. 6 is a block diagram illustrating a coefficient extraction unit included in a predistortion apparatus according to another embodiment of the present invention.

Referring to FIG. 6, the coefficient extraction unit 520 includes a plurality of coefficient extractors 521a to 521n.

Each coefficient extractor (for example, 521a) receives the nonlinear signal 550, the control signal 580 and the output signal 540 of the predistortion unit 510 to output a predistortion coefficient (for example, 560a, $a_1$). However, one coefficient extractor (for example, 521a) that is selected from among the coefficient extractors 521a to 521n according to the control signal 580 performs the above-described input/output operation, and the other coefficient extractors 521b to 521n do not operate. Herein, each of predistortion coefficients 560a to 560n is composed of a plurality of coefficients.

A coefficient extractor (for example, 521a) selected according to the control signal 580 extracts a predistortion coefficient (for example, 560a) using the received nonlinear signal 550 and output signal 540. Adaptive algorithms such as RLS and LMS may be used for extracting a predistortion coefficient (for example, 560a). Also, the predistortion coefficients 560 may be polynomial coefficients that are included in a Volterra series model based on the memory effect or a model applying Volterra series.

Equations (5) to (8) below are used for an operation where each coefficient extractor (for example, 521a) according to an embodiment of the present invention extracts a predistortion coefficient (for example, 560a).

$$X_1(n) = \sum_{p=1}^{P_1} \sum_{q_1=0}^{N_1-1} a_{1,p,q_1} z(n-q_1)|z(n-q_1)|^{p-1} \quad (5)$$

$$e_1 = x(n) - x_1(n) \quad (6)$$

where z(n) is a value that is obtained by dividing the nonlinear signal 550 by an amplification gain of a nonlinear device (for example, a power amplifier), $a_{1,p,q_1}$ are a plurality of polynomial coefficients of which the predistortion coefficient 560a specified according to a variable (p, $q_1$) are composed, and $e_1$ indicates an error between the output signal 540 and $x_1$(n) in Equation (5).

Equations (5) and (6) are used for the first coefficient extractor 521a. The first coefficient extractor 521a extracts the predistortion coefficient 560a where a value of $e_1$ becomes minimized, and delivers the extracted coefficient to the predistortion unit 510.

Likewise, Equations (7) and (8) below are used when the other coefficient extractors 521b to 521n extract the predistortion coefficients 560b to 560n, respectively. The detailed descriptions of the coefficient extractors 521b to 521n are the same as the above description of the first coefficient extractor 521a.

$$X_N(n) = \sum_{p=1}^{P_N} \sum_{q_N=0}^{N_N-1} a_{N,p,q_N} z(n-q_N)|z(n-q_N)|^{p-1} \quad (7)$$

$$e_N = x(n) - x_N(n) \quad (8)$$

Predistortion Unit 2

Figure 7:
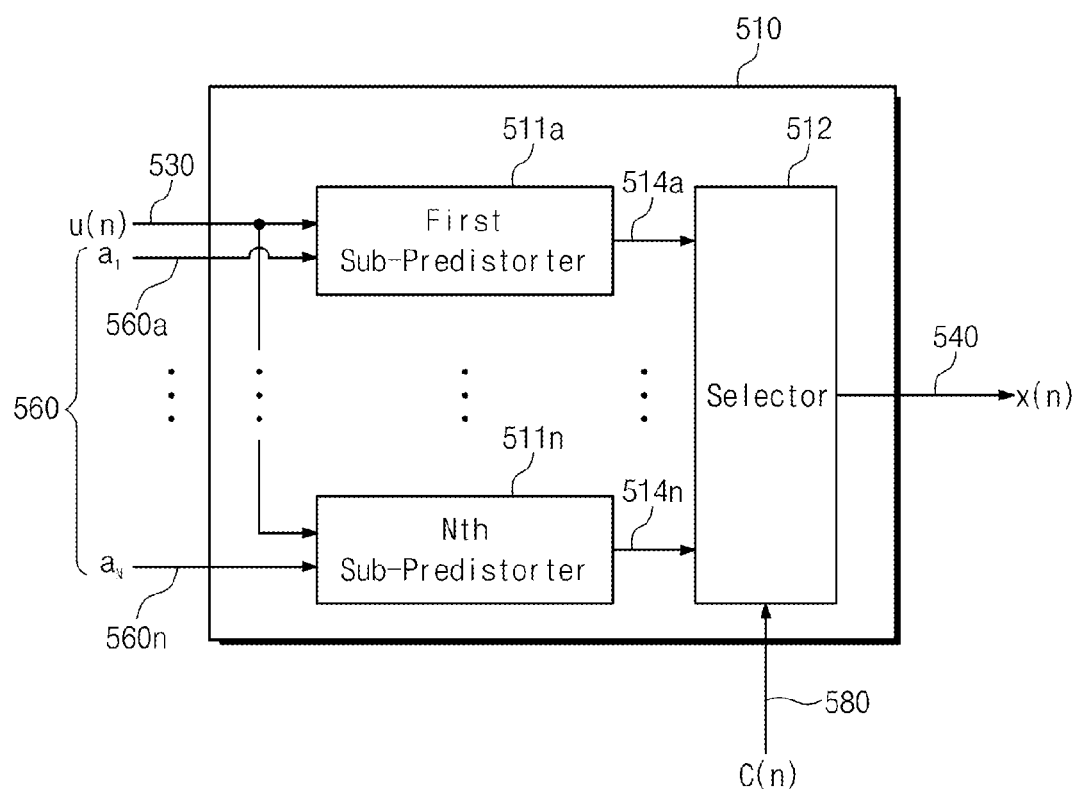
FIG. 7 is a block diagram illustrating a predistortion unit included in a predistortion apparatus according to another embodiment of the present invention.

FIG. 7 is a block diagram illustrating a predistortion unit included in a predistortion apparatus according to another embodiment of the present invention.

Referring to FIG. 7, the predistortion unit 510 includes a plurality of sub-predistorters 511a to 511n and a selector 512.

Each sub-predistorter (for example, 511a) receives the input signal 530 and a predistortion coefficient (for example, 560a) to output a signal (for example, 514a) that is generated by predistorting the received input signal 530. As a result, the sub-predistorters 511a to 511n predistort the input signal 530 with the predistortion coefficients 560a to 560n to output the outputs 514a to 514n to the selector 512, respectively. However, an output selected as the output signal 540 of the predistortion unit 510 is determined by the selector 512.

The selector 512 receives the outputs 514a to 514n of the respective sub-predistorters 511a to 511n and the control signal 580 to output one of the received outputs 514a to 514n as the output signal 540.

Predistortion Coefficient Extraction and Update 2

When the number of the sub-predistorters 511a to 511n is equal to the number of the coefficient extractors 521a to 521n, each sub-predistorter (for example, 511a) and each coefficient extractor (for example, 521a) have a constant correspondence relationship. Referring to FIGS. 6 and 7, the predistortion coefficient 560a that is extracted by the first coefficient extractor 521a selected according to the control signal 580 is delivered to the first sub-predistorter 511a. Herein, the first coefficient extractor 521a extracts the predistortion coefficient 560a using the output signal 540, which is generated through predistortion in the first sub-predistorter 511a selected according to the control signal 580, and the nonlinear signal 550 generated in response to the output signal 540. Therefore, the predistortion coefficient of the first sub-predistorter 511a is updated to the predistortion coefficient 560a that is extracted in the first coefficient extractor 521a. In this scheme, the other second to Nth sub-predistorters 511b to 511n and the other second to Nth coefficient extractors 521b to 521n have a constant correspondence relationship.

As a result, in the case of the predistortion apparatus according to an embodiment of the present invention, a signal inputted to the sub-predistorters 511b to 511n is not a signal divided according to a certain reference (for example, intensity of a signal) but is the input signal 530 entirely. Also, even in the case for coefficient extraction, a predistorted signal that is generated with the entirety of input signal 530 becomes the nonlinear signal 550 by a nonlinear device (for example, a power amplifier), and predistortion coefficients to be used in the respective sub-predistorters 511b to 511n are extracted with the generated nonlinear signal 550. Therefore, when the predistortion apparatus according to an embodiment of the present invention linearizes an output of a nonlinear device that uses a wideband signal, the memory effect is reflected more effectively than a typical predistortion apparatus, the nonlinear maximum-order term of the predistortion apparatus is lowered, and moreover, the complexity of configuration is decreased.

Predistortion Apparatus 4

Figure 8:
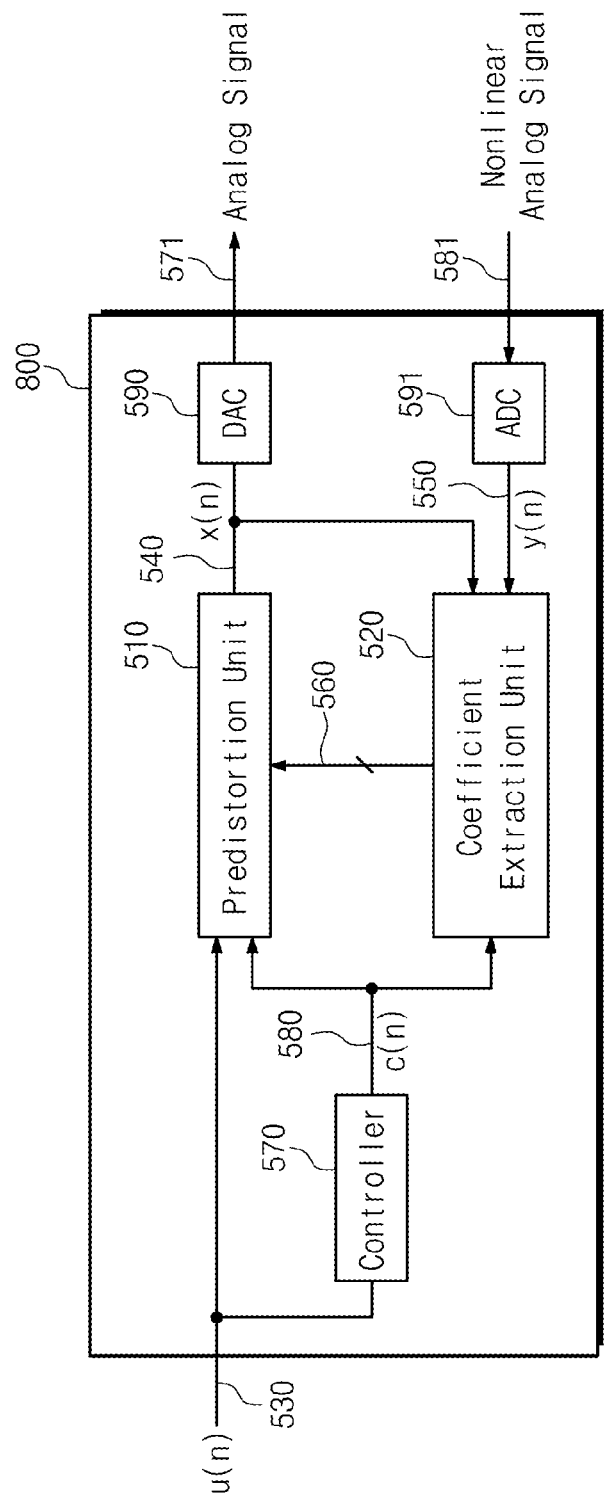
FIG. 8 is a block diagram illustrating a predistortion apparatus according to another embodiment of the present invention.

FIG. 8 is a block diagram illustrating a predistortion apparatus according to another embodiment of the present invention.

Referring to FIG. 8, a predistortion apparatus 800 according to another embodiment of the present invention includes a predistortion unit 510, a coefficient extraction unit 520, a DAC 590, and an ADC 591.

The detailed configurations of the predistortion unit 510 and coefficient extraction unit 520 are as described above with reference to FIGS. 5 to 7. An input signal 530, an output signal 540, and a nonlinear signal 550 are digital signals.

The DAC 590 receives the output signal 540 of the predistortion unit 510, and converts the output signal 540 into an analog signal 571 to output the converted analog signal. When a nonlinear device (not shown) is an analog circuit, the DAC 590 converts the predistorted output signal 540 into the analog signal 571 and delivers the analog signal 571 to the nonlinear device.

The ADC 591 receives a nonlinear analog signal 581 that is generated in response to the analog signal 571, and converts the nonlinear analog signal 581 into the nonlinear signal 550 to output the converted signal 550 to the coefficient extraction unit 520.

Predistortion Method

Figure 9:
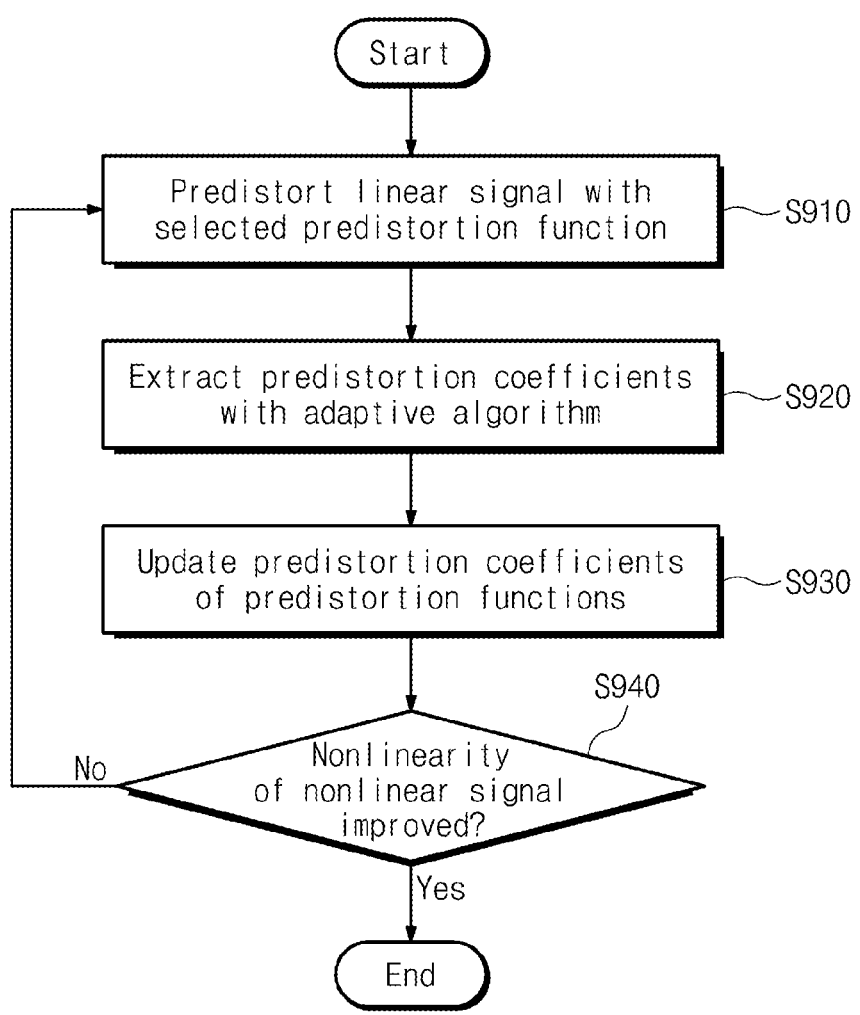
FIG. 9 is a flowchart illustrating a predistortion method according to an embodiment of the present invention.

FIG. 9 is a flowchart illustrating a predistortion method according to an embodiment of the present invention.

Referring to FIG. 9, a predistortion method according to an embodiment of the present invention includes operation S910 of predistorting a signal, operation S920 of extracting predistortion coefficients, operation S930 of updating predistortion coefficients, and operation S940 of determining whether nonlinearity has been improved.

Operation S910 is one that predistorts an input signal into distortion signals with a plurality of predistortion functions having respective predistortion coefficients, and selectively outputs one of the distortion signals according to intensity of the input signal. An output distortion signal is not a signal, which is divided from the input signal according to a certain reference (for example, intensity of a signal), but is one of signals that are generated by predistorting the entirety of input signal.

Operation S920 is one that selects one algorithm from among a plurality of adaptive algorithms according to intensity of a nonlinear signal that is generated in response to the output distortion signal, and extracts predistortion coefficients using the nonlinear signal and the output distortion signal. A curve fitting algorithm is used for extracting a predistortion coefficient. Curve fitting algorithms that are generally used are adaptive algorithms such as RLS, LMS, LS and neural network.

Operation S930 is one that updates the predistortion coefficients of the predistortion functions in operation S910 to the predistortion coefficients that have been extracted in operation S920.

In this embodiment, a plurality of predistortion coefficients may be polynomial coefficients that are included in a Volterra series model based on the memory effect or a model applying Volterra series. Also, when a nonlinear device is a power amplifier, intensity of a nonlinear signal and intensity of the output distortion signal may have a constant proportional relationship. Similarly to the above description, when a classification reference based on intensity of a nonlinear signal is the same as a classification reference based on intensity of an input signal and the number of predistortion functions is equal to the number of adaptive algorithms, each predistortion function and each adaptive algorithm have a constant correspondence relationship. A predistortion coefficient that is extracted by a first adaptive algorithm selected according to intensity of a nonlinear signal is delivered to a first predistortion function. Herein, the first adaptive algorithm extracts the predistortion coefficient using a distortion signal, which is generated through predistortion by a first predistortion function selected according to intensity of an input signal, and a nonlinear signal generated in response to the distortion signal. Therefore, the predistortion coefficient of the first predistortion function is updated to the predistortion coefficient that is extracted in the first adaptive algorithm. In this scheme, the other second to Nth predistortion functions and the other second to Nth adaptive algorithms have a constant correspondence relationship.

When an input signal, a distortion signal and a nonlinear signal are digital signals, the predistortion method may further include an operation that converts an output distortion signal into an analog signal, and an operation that converts a nonlinear analog signal, generated in response to the analog signal, into a nonlinear signal.

Moreover, when an input signal is a wideband signal, a plurality of predistortion functions may be functions that are included in a Volterra series model based on the memory effect or a model applying Volterra series.

As a result, when the predistortion method according to an embodiment of the present invention linearizes an output of a nonlinear device that uses a wideband signal, the memory effect is reflected more effectively than a typical predistortion method, the nonlinear maximum-order term of the predistortion apparatus is lowered, and moreover, the complexity of configuration is decreased.

According to the above-described embodiments of the present invention, the memory effect is reflected when compensating for the nonlinear distortion of the system using the wideband signal.

Moreover, by reflecting the memory effect, performance for compensating for nonlinear distortion is enhanced.

Moreover, by reflecting the memory effect, nonlinear distortion is compensated for, and also complexity in implementation is improved.

Moreover, by reflecting the memory effect, nonlinear distortion is compensated for, and also the nonlinear maximum-order term is lowered.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A predistortion apparatus comprising:
a predistortion unit comprising a plurality of sub-predistorters which respectively predistort an applied input signal with a plurality of separate predistortion coefficients, and selecting and outputting one of outputs of the sub-predistorters as an output signal according to intensity of the input signal; and
a coefficient extraction unit selecting one of a plurality of coefficient extractors according to intensity of a nonlinear signal which is generated in response to the output signal, extracting a plurality of predistortion coefficients with the nonlinear signal and the output signal, and delivering the extracted predistortion coefficients to the predistortion unit.

2. The predistortion apparatus of claim 1, wherein:
the predistortion unit comprises a first controller generating a first control signal according to the intensity of the input signal, and a selector selecting the output of the sub-predistorter according to the first control signal, and
the coefficient extraction unit comprises a second controller generating a second control signal for selecting the coefficient extractor according to the intensity of the nonlinear signal.

3. The predistortion apparatus of claim 1, wherein:
the intensity of the nonlinear signal and the intensity of the output signal have a constant proportional relationship, and
the number of sub-predistorters is the same as the number of coefficient extractors.

4. The predistortion apparatus of claim 1, wherein:
the number of input signals divided according to intensity is the same as the number of nonlinear signals divided according to intensity, and
the coefficient extraction unit updates the separate predistortion coefficients to the extracted predistortion coefficients according to the intensity of the nonlinear signal.

5. The predistortion apparatus of claim 1, wherein the input signal, the output signal and the nonlinear signal are digital signals.

6. The predistortion apparatus of claim 5, further comprising:
a digital-to-analog converter (DAC) converting the output signal into an analog signal; and
an analog-to-digital converter (ADC) converting a nonlinear analog signal, which is generated in response to the analog signal, into the nonlinear signal.

7. The predistortion apparatus of claim 1, wherein:
the input signal is a wideband signal, and
the predistortion coefficients are polynomial coefficients which are comprised in a Volterra series model based on a memory effect or a model applying Volterra series.

8. The predistortion apparatus of claim 1, wherein:
each of the coefficient extractors uses an adaptive algorithm for extracting the predistortion coefficients, and
the adaptive algorithm is a combination of at least one or two or more of Recursive Least Square (RLS), Least Mean Square (LMS), LS, and neural network.

9. A predistortion apparatus comprising:
a controller outputting a control signal according to intensity of an applied input signal;
a predistortion unit comprising a plurality of sub-predistorters which respectively predistort an applied input signal with a plurality of separate predistortion coefficients, and selecting and outputting one of outputs of the sub-predistorters as an output signal according to the control signal; and
a coefficient extraction unit selecting one of a plurality of coefficient extractors according to the control signal, extracting a plurality of predistortion coefficients with the output signal and a nonlinear signal which is generated in response to the output signal, and delivering the extracted predistortion coefficients to the predistortion unit.

10. The predistortion apparatus of claim 9, wherein:
the predistortion unit comprises a selector selecting the output of the sub-predistorter according to the control signal, and
the number of predistorters is the same as the number of coefficient extractors.

11. The predistortion apparatus of claim 9, wherein the coefficient extraction unit updates the separate predistortion coefficients to the extracted predistortion coefficients according to the control signal.

12. The predistortion apparatus of claim 9, wherein the input signal, the output signal and the nonlinear signal are digital signals.

13. The predistortion apparatus of claim 12, further comprising:
a digital-to-analog converter (DAC) converting the output signal into an analog signal; and
an analog-to-digital converter (ADC) converting a nonlinear analog signal, which is generated in response to the analog signal, into the nonlinear signal.

14. The predistortion apparatus of claim 9, wherein:
the input signal is a wideband signal, and
the predistortion coefficients are polynomial coefficients which are comprised in a Volterra series model based on a memory effect or a model applying Volterra series.

15. A predistortion method comprising:
predistorting an applied input signal into a plurality of distortion signals with a plurality of predistortion functions having respective separate predistortion coefficients, and selectively outputting one of the distortion signals according to intensity of the input signal;
selecting one algorithm from among a plurality of adaptive algorithms according to intensity of a nonlinear signal, which is generated in response to the output distortion signal, to extract a plurality of predistortion coefficients from the nonlinear signal and the output distortion signal; and repeatedly updating the separate predistortion coefficients to the extracted predistortion coefficients until nonlinearity of the nonlinear signal is improved at a predetermined level.

16. The predistortion method of claim 15, wherein:

the intensity of the nonlinear signal and the intensity of the output distortion signal have a constant proportional relationship, and the number of predistortion functions is the same as the number of adaptive algorithms.

17. The predistortion method of claim 15, wherein:

the number of input signals divided according to intensity is the same as the number of nonlinear signals divided according to intensity, and the updating of the separate predistortion coefficients updates the separate predistortion coefficients to the extracted predistortion coefficients according to the intensity of the nonlinear signal.

18. The predistortion method of claim 15, wherein the input signal, the output signal and the nonlinear signal are digital signals.

19. The predistortion method of claim 18, further comprising:

converting the output signal into an analog signal; and converting a nonlinear analog signal, which is generated in response to the analog signal, into the nonlinear signal.

20. The predistortion method of claim 15, wherein:

the input signal is a wideband signal, and the predistortion functions are functions which are comprised in a Volterra series model based on a memory effect or a model applying Volterra series.

* * * * *